(12) United States Patent
Jing et al.

(10) Patent No.: US 12,424,580 B2
(45) Date of Patent: Sep. 23, 2025

(54) CHIP PACKAGE WITH INTEGRATED OFF-DIE INDUCTOR

(71) Applicant: XILINX, INC., San Jose, CA (US)

(72) Inventors: Jing Jing, San Jose, CA (US); Shuxian Wu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 684 days.

(21) Appl. No.: 17/680,223

(22) Filed: Feb. 24, 2022

(65) Prior Publication Data

US 2023/0268306 A1   Aug. 24, 2023

(51) Int. Cl.
*H01L 23/00* (2006.01)
*H01L 23/498* (2006.01)

(52) U.S. Cl.
CPC ........ *H01L 24/24* (2013.01); *H01L 23/49816* (2013.01); *H01L 23/49822* (2013.01); *H01L 23/49833* (2013.01); *H01L 23/49838* (2013.01); *H01L 24/19* (2013.01); *H01L 24/20* (2013.01); *H01L 2224/2101* (2013.01); *H01L 2224/2105* (2013.01); *H01L 2224/211* (2013.01); *H01L 2224/214* (2013.01); *H01L 2224/2401* (2013.01); *H01L 2224/2405* (2013.01); *H01L 2224/24226* (2013.01); *H01L 2224/244* (2013.01); *H01L 2924/19011* (2013.01); *H01L 2924/19042* (2013.01); *H01L 2924/3025* (2013.01)

(58) Field of Classification Search
CPC ........ H01L 23/49822; H01L 23/49833; H01L 23/49838; H01L 2924/19042; H01L 23/645; H01L 2924/19011; H01L 23/552; H01L 2924/3025; H01L 24/24; H01L 23/49816; H01L 2224/214; H01L 2224/244; H01L 2224/2101; H01L 2224/2401
USPC ................. 257/786; 438/612, 666
See application file for complete search history.

(56) References Cited

U.S. PATENT DOCUMENTS

| | | |
|---|---|---|
| 8,143,987 B2 | 3/2012 | Kireev |
| 8,592,943 B2 | 11/2013 | Wu et al. |
| 8,624,376 B1* | 1/2014 | Chen .................. H01L 23/5227 257/723 |
| 8,823,133 B2 | 9/2014 | Jenkins et al. |
| 8,860,180 B2 | 10/2014 | Jing et al. |
| 9,330,823 B1 | 5/2016 | Rahman et al. |
| 9,406,738 B2 | 8/2016 | Kireev et al. |
| 11,043,470 B2 | 6/2021 | Jing et al. |
| 2010/0237483 A1* | 9/2010 | Chi ....................... H01L 25/105 257/E23.116 |
| 2011/0068433 A1* | 3/2011 | Kim ...................... H01L 23/645 257/659 |
| 2016/0056226 A1* | 2/2016 | Song .................... H01L 23/3114 257/528 |
| 2016/0090294 A1* | 3/2016 | Wachter ................ H01L 24/97 438/51 |
| 2019/0156994 A1* | 5/2019 | Cox ..................... G06K 19/0712 |

* cited by examiner

*Primary Examiner* — Didarul A Mazumder
(74) *Attorney, Agent, or Firm* — Patterson + Sheridan, LLP

(57) ABSTRACT

A chip package and method for fabricating the same are provided that includes an off-die inductor. The off-die inductor is disposed in a redistribution layer formed on a bottom surface of an integrated circuit (IC) die. The redistribution layer is connected to a package substrate to form the chip package.

20 Claims, 11 Drawing Sheets

402 — IN A REDISTRIBUTION LAYER FORMED ON AN IC DIE, FORMING A FIRST PLURALITY OF VIAS, A SECOND PLURALITY OF VIAS, AND A THIRD PLURALITY OF VIAS ON CONTACT PADS OF THE IC DIE

404 — FORMING METAL TRACES OF THE REDISTRIBUTION LAYER ON THE FIRST, SECOND, AND THIRD PLURALITY OF VIAS, THE METAL TRACES FORMING A GROUND PLANE AND PORTIONS OF A SHIELD

406 — FORMING A FOURTH PLURALITY OF VIAS, A FIFTH PLURALITY OF VIAS, AND A SIXTH PLURALITY OF VIAS OF THE REDISTRIBUTION LAYER ON THE METAL TRACES, THE FOURTH PLURALITY OF VIAS FORMING PORTIONS OF THE SHIELD, AND THE FIFTH AND SIXTH PLURALITY OF VIAS FORMING PORTIONS OF AN INDUCTOR

408 — FORMING METAL TRACES OF THE REDISTRIBUTION LAYER ON THE FOURTH, FIFTH, AND SIXTH PLURALITY OF VIAS, THE METAL TRACES CONTACTING THE FOURTH PLURALITY OF VIAS FORMING PORTIONS OF THE SHIELD, AND THE METAL TRACES CONTACTING THE CONTACTING FIFTH AND SIXTH PLURALITY OF VIAS FORMING PORTIONS OF THE INDUCTOR

410 — FORMING A SEVENTH PLURALITY OF VIAS, AN EIGHTH PLURALITY OF VIAS, AND A NINTH PLURALITY OF VIAS OF THE REDISTRIBUTION LAYER ON THE METAL TRACES, THE SEVENTH PLURALITY OF VIAS FORMING PORTIONS OF THE SHIELD, AND THE EIGHTH AND NINTH PLURALITY OF VIAS FORMING PORTIONS OF THE INDUCTOR

412 — FORMING METAL TRACES OF THE REDISTRIBUTION LAYER ON THE SEVENTH, EIGHTH AND NINTH PLURALITY OF VIAS, THE METAL TRACES CONTACTING THE SEVENTH PLURALITY OF VIAS FORMING PORTIONS OF THE SHIELD, AND THE METAL TRACES CONTACTING THE CONTACTING EIGHTH AND NINTH PLURALITY OF VIAS FORMING PORTIONS OF THE INDUCTOR

414 — COMPLETING THE REDISTRIBUTION LAYER

416 — MECHANICALLY AND ELECTRICALLY COUPLING THE REDISTRIBUTION LAYER TO A PACKAGE SUBSTRATE TO FORM A CHIP PACKAGE

418 — MECHANICALLY AND ELECTRICALLY COUPLING THE CHIP PACKAGE TO A PRINTED CIRCUIT BOARD TO FORM AN ELECTRONIC DEVICE

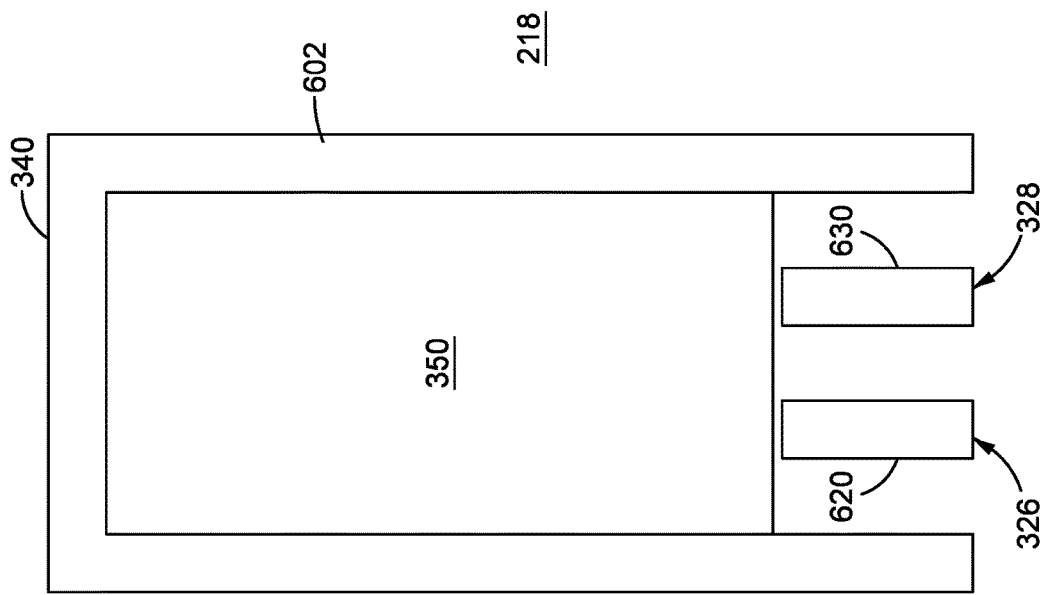
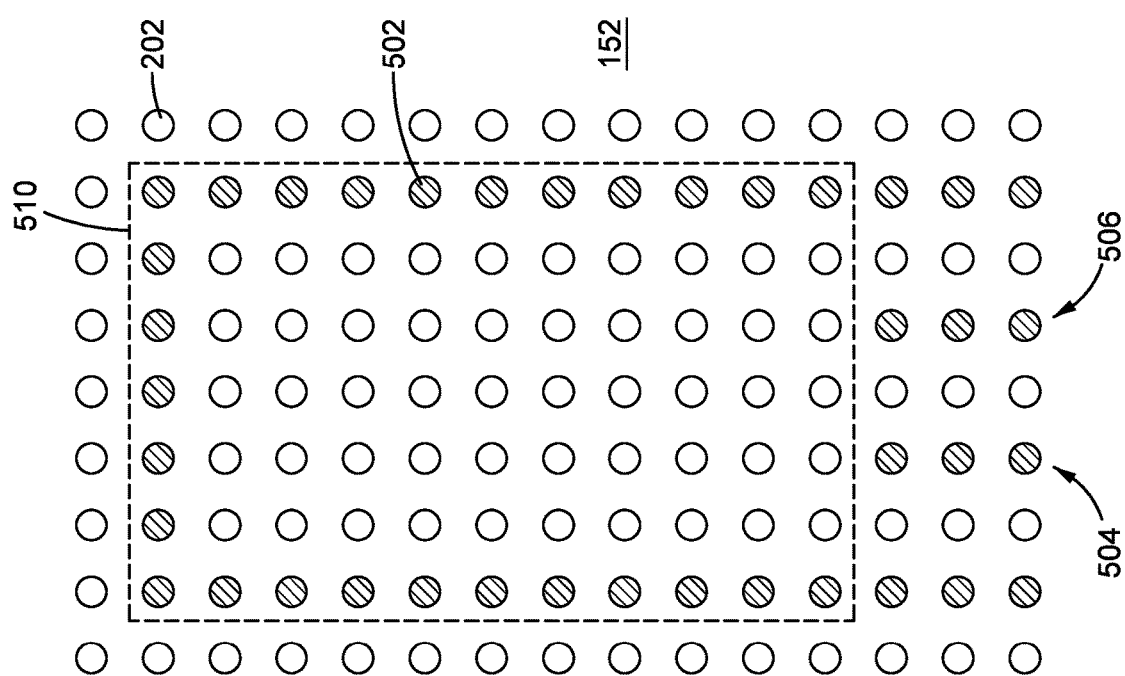

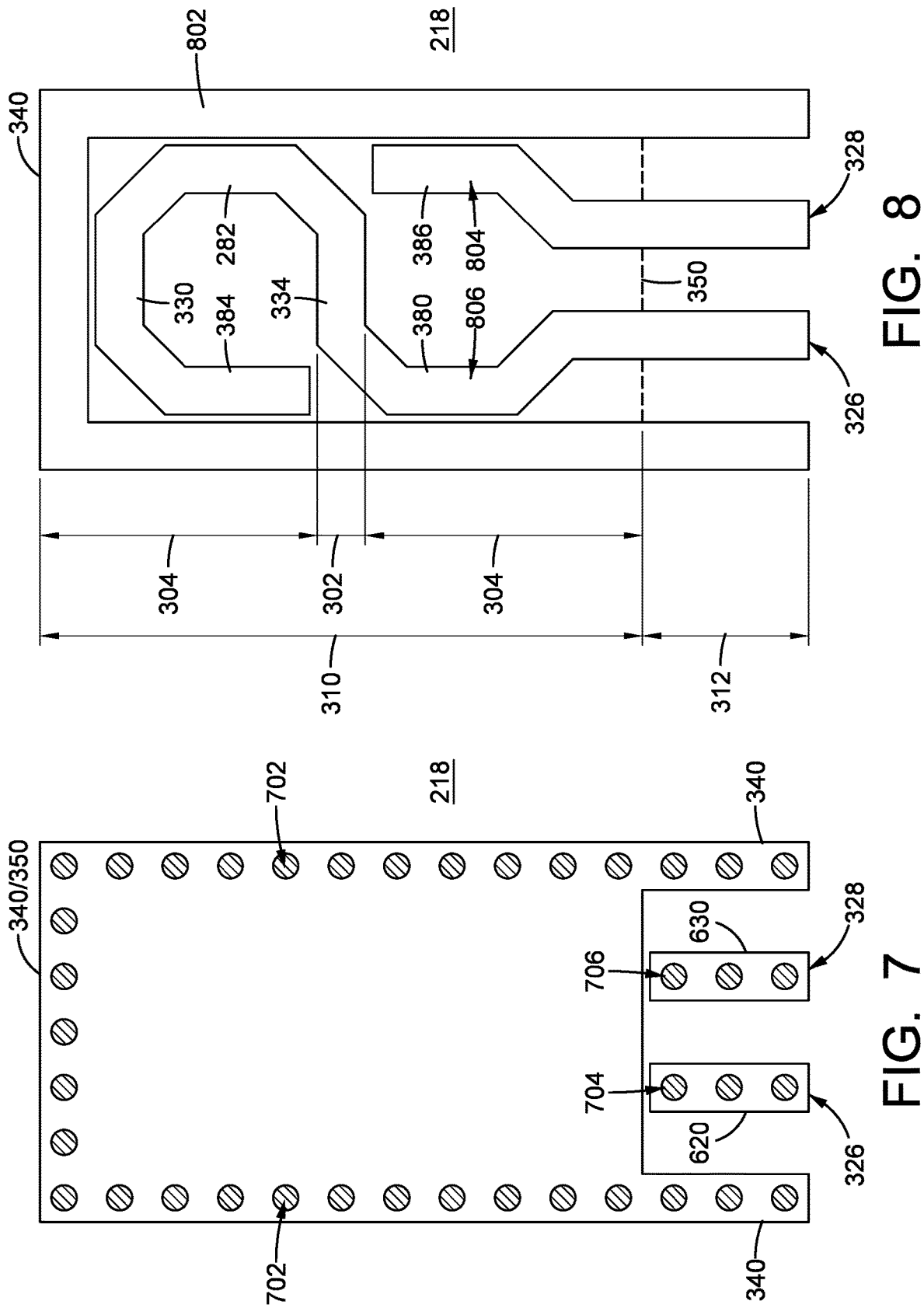

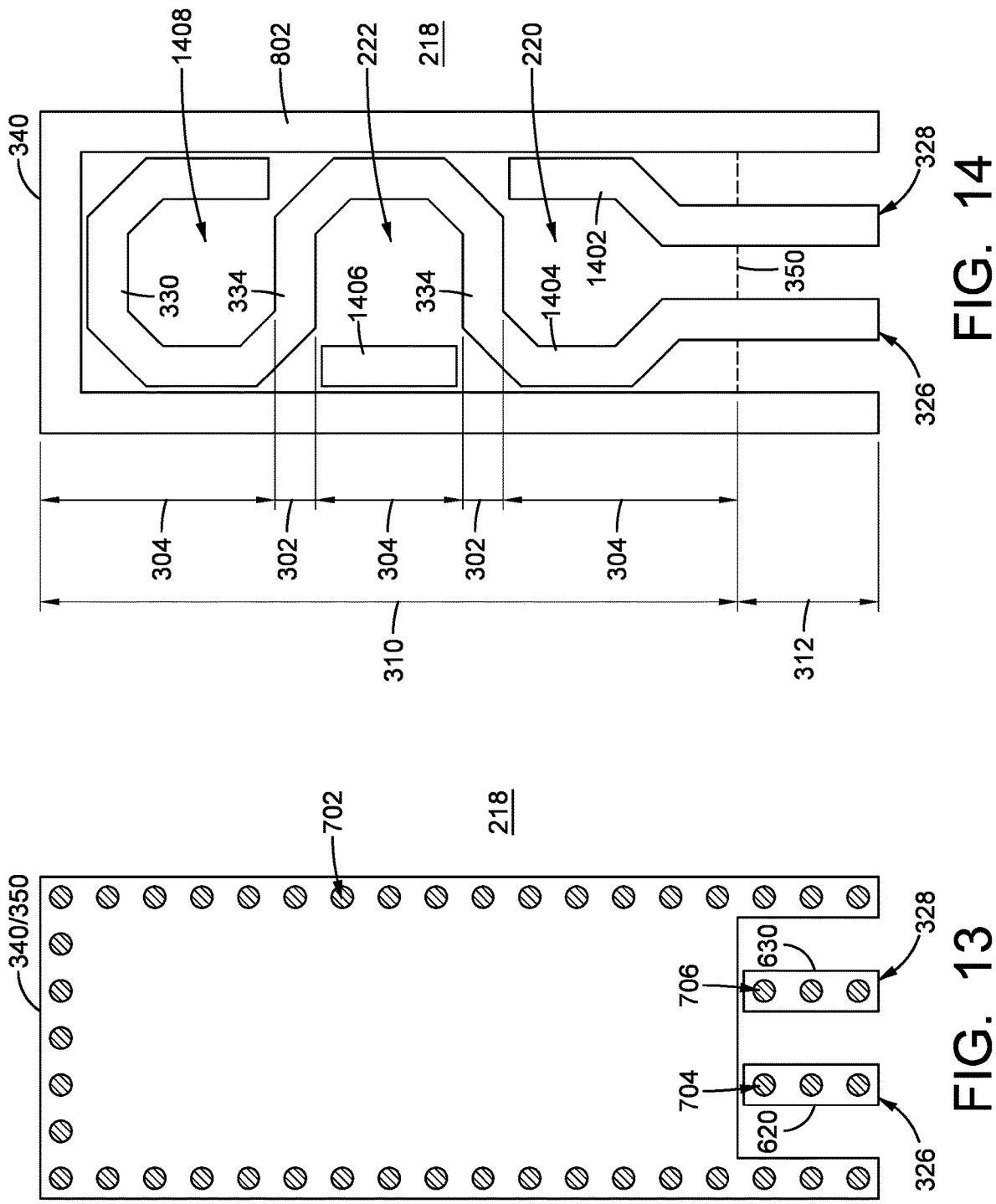

CHIP PACKAGE WITH INTEGRATED OFF-DIE INDUCTOR

TECHNICAL FIELD

Embodiments of the present invention generally relate to a chip package having ex-situ die inductor, and in particular, to a chip package having an inductor disposed in a redistribution layer adjacent an integrated circuit die of the chip package.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a die side (i.e., top surface) of the package substrate while a ball side (i.e., bottom surface) of the package substrate is mounted to a printed circuit board (PCB). The IC dies may include memory, logic or other IC devices.

Inductors and transformer are often used in chip packages that include radio frequency (RF) integrated circuit (IC) designs, including LC VCO circuits. Accurate and predictable inductor characteristics with high quality factors are desirable for successful RF IC design, especially for LC VCO circuits, in order to meet product performance and frequency targets. As technology continues to evolve, the number of devices dramatically increases within a given area of an IC. This increased density in an IC can cause increased parasitic effects on devices or circuits.

The environmental effect can dramatically degrade an inductor quality factor (Q-factor) and alter its inductance value from its modeled behavior, causing IC devices to be unable to meet their intended performance and causing shifts in frequency from their design targets. The environmental effect is hard to predict before manufacture because various direct current (DC) or alternating current (AC) loops can be formed as a return path by the surrounding circuits, power grids, and complicated routings around the inductors.

Therefore, a need exists for a chip package with an improved inductor design.

SUMMARY

A chip package and method for fabricating the same are provided that includes an off-die inductor. Off-die, as used herein, mean ex-situ an integrated circuit (IC) die of the chip package. The off-die inductor is disposed in a redistribution layer disposed adjacent the IC die. The off-die inductor can be used as standalone device or to be integrated to the circuits as part of a chiplet or IC die, and utilized to form an integrated 3D stacking system with advanced packaging. As the off-die inductor is not part of the IC die itself, metal layers of the IC die that conventionally would have been dedicated for forming the inductor are now free for other use or additional structures within the IC die.

The off-die inductor is disposed in a redistribution layer formed on a bottom surface of an integrated circuit (IC) die. The redistribution layer is connected to a package substrate to form the chip package.

In one example, a chip package is provided that includes an integrated circuit (IC) die, a package substrate, a redistribution layer (RDL), and an inductor. The package substrate has a die side and a ball side. The RDL is disposed between the IC die and the die side of the package substrate. The RDL includes at least a first conductive layer and a second conductive layer that are patterned to form RDL circuitry within the RDL. The RDL circuitry connects the IC die to the package substrate. The inductor is formed from portions of the first conductive layer and the second conductive layer of the RDL.

In another example, the RDL includes a shield formed from portions of the first conductive layer and the second conductive layer of the RDL, wherein the shield circumscribes at least three sides of the inductor.

In another example, the RDL includes a ground plane disposed between the inductor and the IC die. The ground plane may be optionally formed from a portion of the third metal layer disposed between a head region of the inductor and the IC die.

In yet another example a chip package is provided that includes an integrated circuit (IC) die, a package substrate, a redistribution layer (RDL), and an inductor. The package substrate has a die side and a ball side. The RDL is disposed between the IC die and the die side of the package substrate. The inductor is disposed in the RDL and is sandwiched between the IC die and the package substrate. The inductor includes a first terminal coupled to circuitry of the IC die and a second terminal coupled to the circuitry of the IC die.

In still another example, a method for fabricating a chip package is provided. The method includes forming an inductor within a redistribution layer (RDL) formed on an integrated circuit (IC) die; and stacking the RDL with a package substrate to form a chip package.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a flow diagram of a method for fabricating a chip package having an off-die inductor fabricated within a redistribution layer (RDL) adjacent an integrated circuit (IC) die.

FIGS. 5-10 are a sequence of schematic bottom views depicting an off-die inductor various stages of fabrication within the redistribution layer (RDL).

FIGS. 11-16 are a sequence of schematic bottom views depicting another off-die inductor various stages of fabrication within the redistribution layer (RDL).

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that includes an off-die inductor. Off-die, as used herein, mean ex-situ an integrated circuit (IC) die of the chip package. The off-die inductor is disposed in a redistribution layer disposed adjacent the IC die. The off-die inductor can be used as standalone device or to be integrated to the circuits as part of a chiplet or IC die, and utilized to form an integrated 3D stacking system with advanced packaging. As the off-die inductor is not part of the IC die itself, metal layers of the IC die that conventionally would have been dedicated for forming the inductor are now free for other use or additional structures within the IC die. For example, the off-die inductor to opens up extra room for power routing, achieve larger enough desired inductance value for VCO design within a small rectangular area, achieve high Q-value for high performance VCO design, frees up more thick metal layers on the top die for fabric power delivery network (PDN) to reduce ohmic loss, build robust isolation scheme to shield new inductor from environmental effect in the stacked 3D system environment, and eliminate noise/disturbance to the circuits under the inductor region in the 3D stacked technology.

The off-die inductor utilizes a small rectangular shaped area within package bump field in a 3D stacking architecture, while also being able to achieve high device performance with desired inductance value for VCO design. The off-die inductor frees up more metal layers in the IC die for power routing, which improves power integrity in the active side to active side IC die stacking integration. In one example, the off-die inductor is connected to VCO circuits located on IC die using vertical integration.

In some examples, a system level isolation scheme is provided to shield the integrated off-die inductor from electromagnetics field within the 3D stacked environmental. Electrical and magnetic fields may be attenuated or prevented from penetrating to circuits within the adjacent IC die by using a ground plane located between the off-die inductor and IC die. The ground plane may be a mesh, include a plurality of apertures, holes, have interleaved fingers, be solid or have another suitable configuration. The ground plane is electrically connected to a vertical isolation wall surrounding the coils of the inductor.

Figure 1:
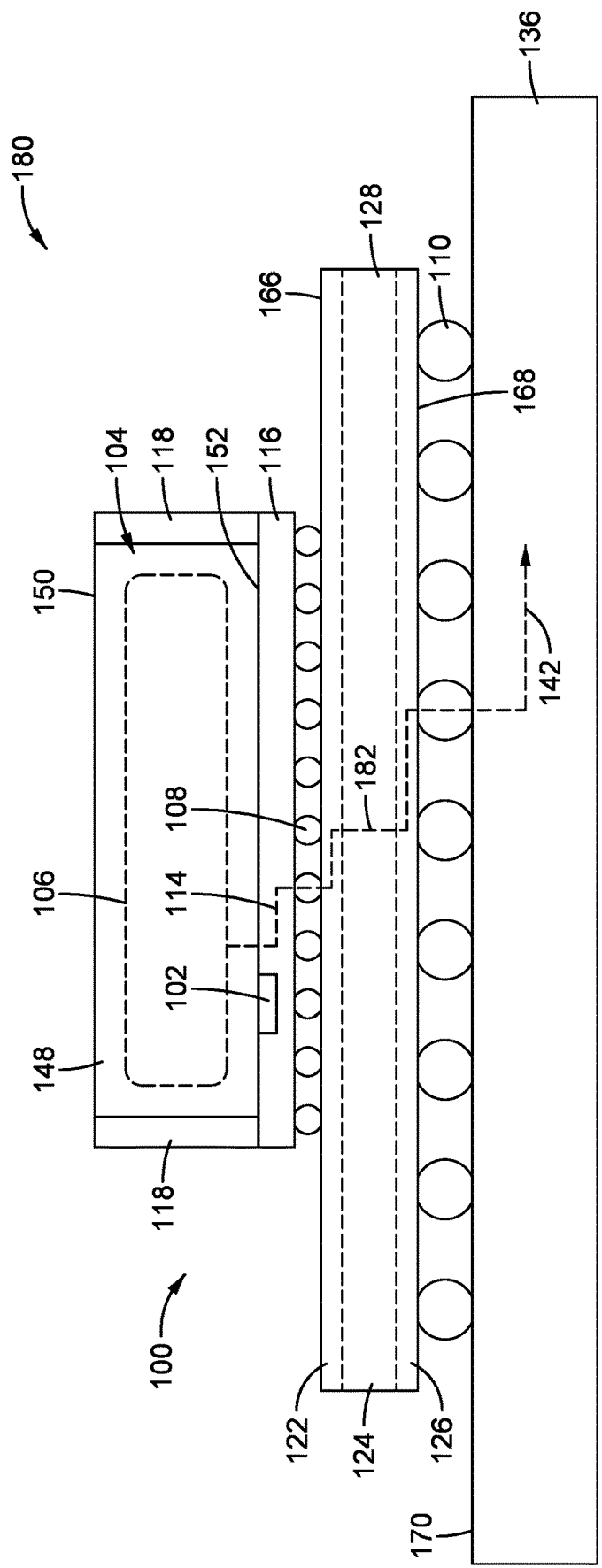
FIG. 1 is a schematic sectional view of another example of chip package having an off-die inductor disposed in a redistribution layer (RDL) disposed between an integrated circuit (IC) die and a package substrate of the chip package.

Turning now to FIG. 1, a schematic sectional view of a chip package 100 is illustrated. The chip package 100 includes at least one integrated circuit (IC) die 104, a redistribution layer (RDL) 116 and a package substrate 128. The RDL 116 is formed on the lower surface of the IC die 104. The RDL 116 is coupled to the package substrate 128. The package substrate 128 of the chip package 100 may be mounted on a printed circuit board (PCB) 136 to form an electronic device 180.

At least one off-die inductor 102 is formed in the RDL 116 adjacent the IC die 104. Although in FIG. 1 only a single off-die inductor 102 is shown, as many off-die inductors 102 may be utilized as desired and as space permits. In one example, the off-die inductor 102 is sandwiched between the IC die 104 and the package substrate 128.

The off-die inductor 102 is coupled to functional circuitry 106 of the IC die 104, rather than being formed within the IC die 104 or located on the package substrate 128 or other location within the chip package 100. Thus, the off-die inductor 102 is very close to the IC die 104 which enables excellent performance. Additionally, as the off-die inductor 102 is not formed within the IC die 104, space normally occupied by on-die inductors is now free within the IC die 104 for additional IC device, improved power routing, and the like.

Continuing to refer to FIG. 1, the IC die 104 of the chip package 100 includes functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads (later shown in FIG. 2).

The RDL 116 is formed on the contact pads exposed on the die bottom surface 152 of the IC die 104. The RDL 116 includes routing formed from a plurality of patterned metal layers disposed between a plurality of dielectric layers. The patterned metal layers are coupled by via to form interconnect circuitry 114 of the RDL 116 that connect the functional circuitry 106 to package circuitry 182 formed in the package substrate 128, and to the off-die inductor 102. In the example depicted in FIG. 1, the interconnect circuitry 114 of the RDL 116 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique.

In some examples such as depicted in FIG. 1, the RDL 116 is wider than the IC die 104 to accommodate a fan out using interconnect circuitry 114 of the RDL 116. When the RDL 116 is wider than the IC die 104, a mold compound 118 surrounding the lateral sides of the IC die 104 may be utilized to provide structural support for portions of the RDL 116 that extend beyond the sides of the IC die 104.

Figure 1A:
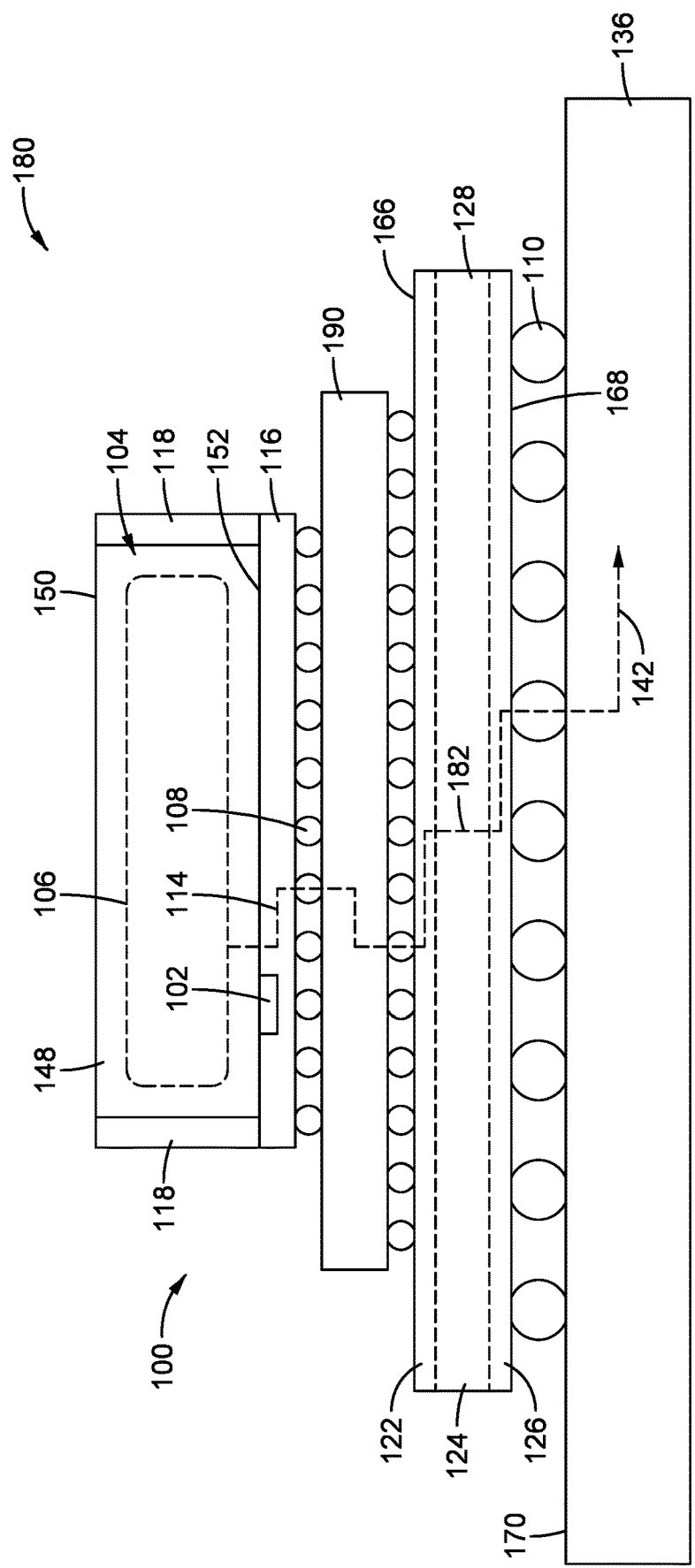
FIG. 1A is a schematic sectional view of another example of chip package having an off-die inductor disposed in a redistribution layer (RDL) disposed between an integrated circuit (IC) die and a package substrate of the chip package.

Although the RDL 116 is shown disposed contacting the IC die 104 in FIG. 1, the RDL 116 may alternatively or additionally be located in other portions of the chip package 100 illustrate in FIG. 1, or other chip packages having alternative configurations. For example as depicted in FIG. 1A, the chip package 100 includes an interposer 190 disposed between the package substrate 128 and the IC die 104. As shown in FIG. 1A, the chip package 100 illustrates an RDL 116 disposed in three alternative locations. The chip package 100 of FIG. 1A may have the RDL 116 in any one of the locations shown, any two of the locations shown, or all of the locations shown in FIG. 1A. The off-die inductor 102 may disposed on any one of the RDLs 116 shown, any two of the RDLs 116 shown, or all of the RDLs 116 shown in FIG. 1A. In FIG. 1A, the RDL 116 is disposed on both sides of the interposer 190, and on the bottom surface 152 of the IC die 104.

Figure 2:
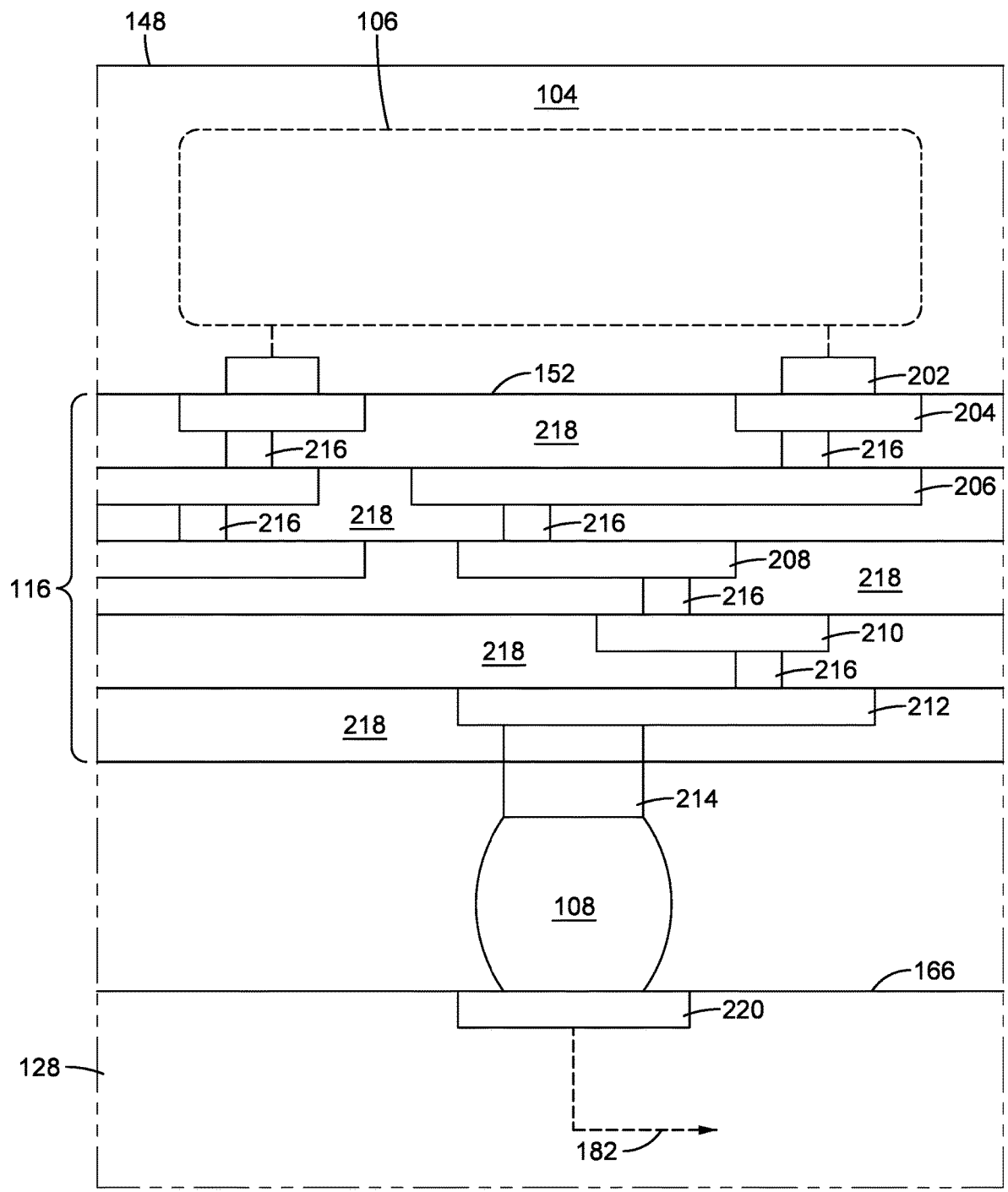
FIG. 2 is a schematic sectional view of a portion of the chip package illustrating one example of the connections between an integrated circuit (IC) die and a package substrate through a redistribution layer (RDL).

FIG. 2 is a schematic sectional view of a portion of the chip package 100 illustrating one example of the connections between the IC die 104 and the package substrate 128 through the RDL 116.

The RDL 116 includes a plurality of conductive layers and vias 216 which are patterned to form the RDL circuitry 114. There can be between two to seven patterned conductive layers forming the RDL circuitry 114. In the example of FIG. 2, five conductive layers 204, 206, 208, 210, 212 are shown, although a different number of conductive layers may be utilized. The conductive layers 204, 206, 208, 210, 212 are patterned to form lines that are connected by vias 216 to form the RDL circuitry 114. The patterned conductive layers 204, 206, 208, 210, 212 are separated by dielectric layers 218.

The one end of the routings comprising the RDL circuitry 114 terminates at the first conductive layer 204. The routing terminations of RDL circuitry 114 at the first conductive layer 204 are coupled to contact pads 202 formed on the bottom surface 152 of the IC die 104. The other end of the routings comprising the RDL circuitry 114 terminates at the last conductive layer 212. The routing terminations of RDL circuitry 114 at the last conductive layer 212 are coupled to an under-bump layer 214 upon which the interconnect 108 is formed. The interconnect 108 couples the RDL circuitry 114 to a bond pad formed on a top surface 166 of the package substrate 128, thus connecting the RDL circuitry 114 to the package circuitry 182 of the package substrate 128.

Returning back to FIG. 1, the package substrate 128 generally includes at least an upper build-up layer 122 disposed on a core 124. Optionally, a lower build-up layer 126 may be disposed on the other side of the core 124 from the upper build-up layer 122. The upper build-up layer 122 includes a plurality of conductive layers and vias that are patterned to provide routing of a portion of the package circuitry 182. One end of the package circuitry 182 formed in the upper build-up layer 122 terminates at the bond pad formed on the top surface 166 of the package substrate 128 where the package circuitry 182 connects to the interconnect circuitry 114 of the RDL 116. The other end of the package circuitry 182 formed in the upper build-up layer terminates at vias formed through the core 124. The lower build-up layer 126 may be fabricated similar to the upper build-up layer 122. At least one of the upper and lower build-up layers 122, 126 includes a fan out in the circuitry 182 of the package substrate 128.

In examples where the package substrate 128 does not include a lower build-up layer 126, the vias formed through the core 124 of the package circuitry 182 may be connected by solder balls 110 to circuitry 142 of the PCB 136 that terminates at a PCB top surface 170 of the PCB 136. In examples having a lower build-up layer 126, the vias formed through the core 124 are coupled through the patterned conductive layers and vias of the lower build-up layer 126 such that the package circuitry 182 terminates at a package bottom surface 168. At the package bottom surface 168, the package circuitry 182 is coupled to the circuitry 142 of the PCB 136 by the solder balls 140.

As discussed above, one or more off-die inductors 102 are formed in the RDL 116. The off-die inductor 102 is generally formed from the patterned metal layers comprising the RDL 116. In this manner, the off-die inductor 102 may be formed immediately adjacent the IC die 104 for improved performance, while freeing space within the IC die 104 that can be used for additional IC device, power routing and the like.

Figure 3:
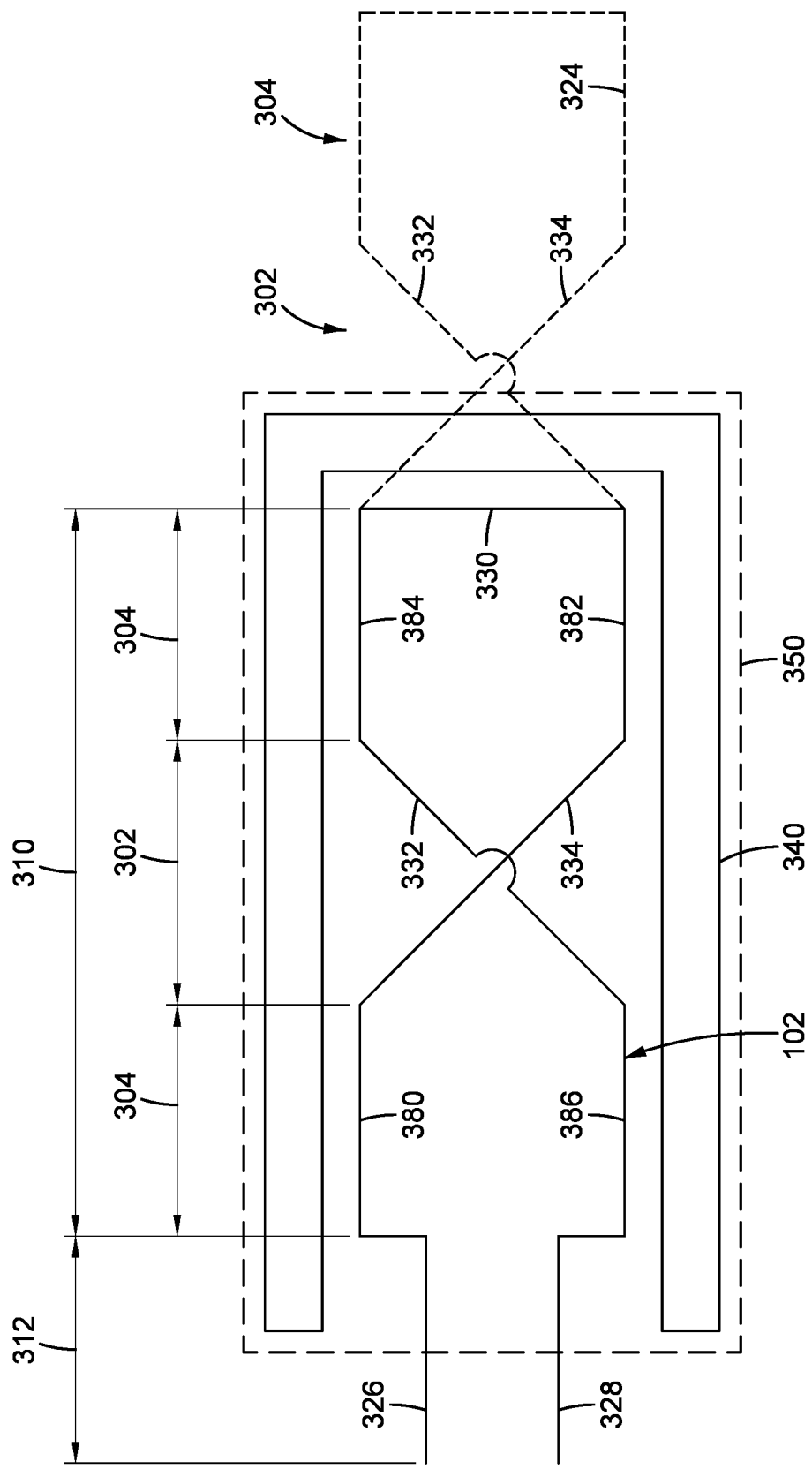
FIG. 3 is a schematic circuit diagram of an off-die inductor.

FIG. 3 is a schematic circuit diagram of one example of an off-die inductor 102 that can be fabricated in an RDL 116. It is contemplated that off-die inductors having other configurations may be fabricated within the patterned metal layers of the RDL 116.

The off-die inductor 102 generally includes a head region 310 and a tail region 312. The tail region 312 generally includes leads 326, 328 that define the terminal ends of the inductor 102. The head region 310 includes loop regions 304 separated by cross over region 302. Generally, there are N cross over region 302 and N+1 loop regions 304, where N is a whole number greater than zero. For example, N may equal 1, 2, 3 or other suitable whole number greater than zero.

The head region 310 generally includes at least two or more connected loops (e.g., coils). In the example depicted in FIG. 3, two coils 320, 322 are shown. Each coil 320, 322 resides in a respective one of the loop regions 304. A third coil 324 is shown in phantom connected on one of the coils 320, 322. Additional loops may be connected to the third coil 324 as desired. As the coils 320, 322 are connected with the second coil 322 separated from the tail region 312 by the first coil 320, the head region 310 generally has a high aspect ratio with the length of the head region 310 (in the direction of loop connections) being at least 3 times greater than the width of the head region 310 (in the perpendicular to the direction of loop connections).

The first coil 320 is coupled to each of the leads 326, 328 that define the terminal ends of the inductor 102. The first coil 320 is coupled to the second coil 322 at the cross over region 302. The cross over region 302 allows a portion of the first coil 320 terminating at the lead 326 to jump over the portion of the first coil 320 terminating at the lead 328 at the interface between the coils 320, 322. The cross over region 302 jumps the traces comprising the inductor 102 by utilizing different metal layers of the RDL 116, as will be detailed further below with reference to FIGS. 5-10.

In the example depicted in FIG. 3, the trace metal comprising the inductor 102 begins at the lead 326 and extends out of the tail region 312 to connect to a first portion 380 of the first coil 320 disposed in the loop region 304 of the head region 310 closest the tail region 312. The trace metal comprising the first portion 380 of the first coil 320 connects to a first jumper trace 334 disposed in the cross over region 302 of the inductor 102. The trace metal comprising the first jumper trace 334 connects to a first portion 382 of the second coil 322 disposed in the second loop region 304. If only two coils 320, 322 are utilized, the first portion 382 of the second coil 322 is connected to a second portion 384 of the second coil 322 by a connection trace 330. If more than two coils 320, 322 are utilized, the first portion 382 of the second coil 322 is connected to a jumper 332 in the next coil 324, and another jumper 334 connects the coil 324 back to the second coil 322. If more than three coils are utilized, the additional coils are connected in the same manner. The trace metal comprising the second portion 384 of the second coil 322 connects to a second jumper 332 disposed in the cross over region 302 of the inductor 102. The trace metal comprising the second jumper 332 connects to a second portion 386 of the first coil 320 disposed in the first loop region 304 of the inductor 102. The trace metal comprising the second portion 386 of the first coil 320 extends out of the head region 310 and into tail region 312 to connect to the lead 328.

The head region 310 of the inductor 102 may be aligned with an optional ground plane 350 (shown in phantom in FIG. 3). The ground plane 350 is also fabricated from one or more of the metal layers of the RDL 116. The ground plane 350 has an area that is larger than an area of the loop and cross over regions 302, 304. In one example, the area of the ground plane 350 is larger than an area of the head region 310. The ground plane 350 may be positioned in the RDL 116 such that the ground plane 350 separates the inductor 102 from the IC die 104. The ground plane 350 is coupled to ground either through the IC die 104 or through the circuitry 182 of the RDL 116 such that the ground plane 350 attenuated and/or protects the functional circuitry 106 of the IC die 104 from electrical and magnetic fields within the chip package 100. The one or more metal layers of the RDL 116 comprising the conductive ground plane 350 may be in the form of a mesh, include a plurality of apertures, holes, have interleaved fingers, be solid or have another suitable configuration.

The head region 310 of the inductor 102 may also include an optional shield 340 (shown in phantom in FIG. 3). The shield 340 may be utilized with or without the optional ground plane 350. The shield 340 is fabricated from one or more of the metal layers of the RDL 116. The shield 340 may be coupled to the ground plane 350, when present. The shield 340 generally circumscribes at least 3 sides of the head region 310, and in some embodiments, circumscribes the entire inductor 102. The shield 340 is coupled to ground either through one or more of the IC die 104, the ground plane 350 or through the circuitry 182 of the RDL 116. The shield 340 is formed from one or more metal layers of the RDL 116. In one example, the shield 340 comprises portions of the same metal layers comprising the inductor 102. As later described below, when the shield 340 is fabricated from multiple metal layers of RDL 116, the multiple metal layers comprising the shield 340 are interconnected by conductive vias within the RDL 116. The shape of the shield 340 may be rectangular, follow the shape of the inductor 102, or other another suitable shape.

FIG. 4 is a flow diagram of a method 400 for fabricating a chip package 100 having an off-die inductor 102 fabricated within a redistribution layer (RDL) 116 adjacent an integrated circuit (IC) die 104. FIGS. 5-10 are a sequence of schematic bottom views depicting the off-die inductor 102 during various stages of fabrication within the RDL 116 during portions of the method 400 described below. The chip packages having off-die inductors fabricated within the RDL may also be fabricated utilizing different techniques.

The method 400 begins at operation 402 by forming a first plurality of vias 502, a second plurality of vias 504, and a third plurality of vias 504 on the contact pads 202 of the IC die 104, as shown in FIG. 5. The first plurality of vias 502 are coupled to ground circuitry of the IC die 104, and will become part of the shield 340 (also as shown in FIG. 3). The second plurality of vias 504 are coupled to power circuitry of the IC die 104, and will become part of the first lead 326 of the inductor 102 as shown in FIG. 3. The third plurality of vias 506 are coupled to power circuitry of the IC die 104, and will become part of the second lead 328 of the inductor 102, also as shown in FIG. 3. Alternatively, the vias 504, 506 may be coupled to contact pads 502 connected to other types of circuitry/devices within the IC die 104. In one example, the vias 502, 504, 506 are plated on the contact pads 202. An edge of the ground plane 350 closest to the tail region 312 is shown in phantom in FIGS. 8-10.

The area inside, i.e., bounded by, the vias 502 is utilized to form the coils 220, 222 of the inductor 102. As depicted in FIG. 5 using the rows and columns of contact pads 202 disposed inside the vias 502, the area available to form the coils 220, 222 (i.e., the head region 310) of the inductor 102 has a high aspect ratio. That is, the number rows (in a direction away from the tail region 312) utilized to form the width of the head region 310 of the inductor 102 is greater than the number of columns utilized to form the height of the head region 310. The height of the head region 310 can easily be increase to accommodate more than two coils 220, 222, while still retaining a narrow width. In one example, the width of the two coils 220, 222 is less than three pitches of the contact pads 202. In another example, the width of the two coils 220, 222 is less than four or five pitches of the contact pads 202. In another example, the height of the two coils 220, 222 is great than or equal to five pitches of the contact pads 202. In still another example, the aspect ratio defined using the pitch of rows to columns of contact pads 502 within head region 310 containing the two coils 220, 222 is greater 5:2 or greater than 5:3.

The dashed line 510 depicted in FIG. 5 illustrates the bounds of the ground plane 350, which is later formed at operation 404. The contact pads 202 of the IC die 104 circumscribed by the dashed line 510 are dummy pads, i.e., not electrically connected to the circuitry 182 of the RDL 116.

The contact pads 202 of the IC die 104 outward of the dashed line 510 may be dummy pads, signal transmission pads, ground pads, or power pad. As the type of contact pads 202 outward of the dashed line 510 is not generally pertinent to the construction of the inductor 102, these pads 202 are illustrated as, but limited to, dummy contact pads.

At operation 402, a dielectric layer 218 is disposed around the vias 502, 504, 506. Alternatively, the dielectric layer 218 may be disposed and patterned on the bottom surface 152 of the IC die, then the vias 502, 504, 506 deposited in the patterned openings formed in the dielectric layer 218.

At operation 404, metal traces 602 are formed on the first vias 502, as illustrated in FIG. 6. The metal traces 602 are fabricated from the first metal layer 204 of the RDL 116, and form a portion of the shield 340. The metal traces 602 may be solid, a mesh or has another suitable geometry.

Also at operation 404, a portion of the first metal layer 204 of the RDL 116 may also be utilized to form the optional ground plane 350. The ground plane 350 and the shield 340 may be formed from a contiguous portion of the first metal layer 204 of the RDL 116. Although the ground plane 350 is illustrated in FIG. 6 as a solid planar sheet of metal material, the ground plane 350 may alternatively may be a mesh, include a plurality of apertures, holes, have interleaved fingers, or have another suitable configuration.

Also at operation 404, a portion of the first metal layer 204 of the RDL 116 forms a trace 620 over and interconnecting the second vias 504. A portion of the first metal layer 204 of the RDL 116 also forms a trace 630 over and interconnecting the third vias 506. The traces 620, 630, being part of the leads 326, 328 of the inductor 102, are spaced and isolated from each other, and also spaced and isolated from ground plane 350 and the shield 340.

At operation 406, a first plurality of vias 702, a second plurality of vias 704, and a third plurality of vias 704 are formed, as shown in FIG. 7. The first plurality of vias 702 are formed on the metal traces 602 and are aligned with the first plurality of vias 502. The first plurality of vias 702, the metal traces 602, and the first plurality of vias 502 form a portion of the shield 340 (also as shown in FIG. 3).

The second plurality of vias 704 are formed on the metal trace 604 and are aligned with the second plurality of vias 504. The second plurality of vias 704, the metal trace 604, and the second plurality of vias 504 form a portion of the first lead 326 of the inductor 102.

Similarly, the third plurality of vias 706 are formed on the metal trace 606 and are aligned with the third plurality of vias 506. The third plurality of vias 706, the metal trace 606, and the third plurality of vias 506 form a portion of the second lead 328 of the inductor 102.

After operation 406 is complete, another dielectric layer 218 is disposed around the vias 702, 704, 706. The vias 702, 704, 706 may be fabricated similar to the vias 502, 504, 506.

At operation 408, metal traces 802, 804 and 806 are formed from the metal layer 206 of the RDL 116 that is disposed next to the metal layer 204, as illustrated in FIG. 8. The metal traces 802 form a portion of the shield 340. The metal traces 802, 804 and 806 may be solid, a mesh or has another suitable geometry. The metal traces 804 and 806 are isolated from the ground plane 350 by one of the dielectric layers 218.

The metal traces 802 are formed on the first plurality of vias 702. The metal traces 802 and vias 702 form part of the shield 340.

Also at operation 408, a portion of the metal layer 206 of the RDL 116 forms a trace 804 over and interconnecting the third plurality of vias 706. The trace 804 extends out of the tail region 312 into the head region 310. The trace 804 also forms the second portion 386 of the first coil 320 in the loop region 304. The trace 804 terminates at or slightly within the cross over region 302.

Also at operation 408, a portion of the metal layer 206 of the RDL 116 forms the trace 806 over and interconnecting the second vias 704. The trace 806 extends out of the tail region 312 into the head region 310. The trace 806 also forms the first portion 380 of the first coil 320 in the loop region 304. The trace 806 extends from the first portion 380 of the first coil 320 into the cross over region 302, and forms the jumper 334. The jumper 334 is not connected to any vias. The trace 806 extends from the jumper 334 in the cross over region 302 to the first portion 382 of the second coil 322 in the second loop region 304. As part of the second coil 322, the trace 806 also includes the connection trace 330 and the second portion 384 of the second coil 322. The trace 806 terminates at or slightly within the cross over region 302.

Figure 9:
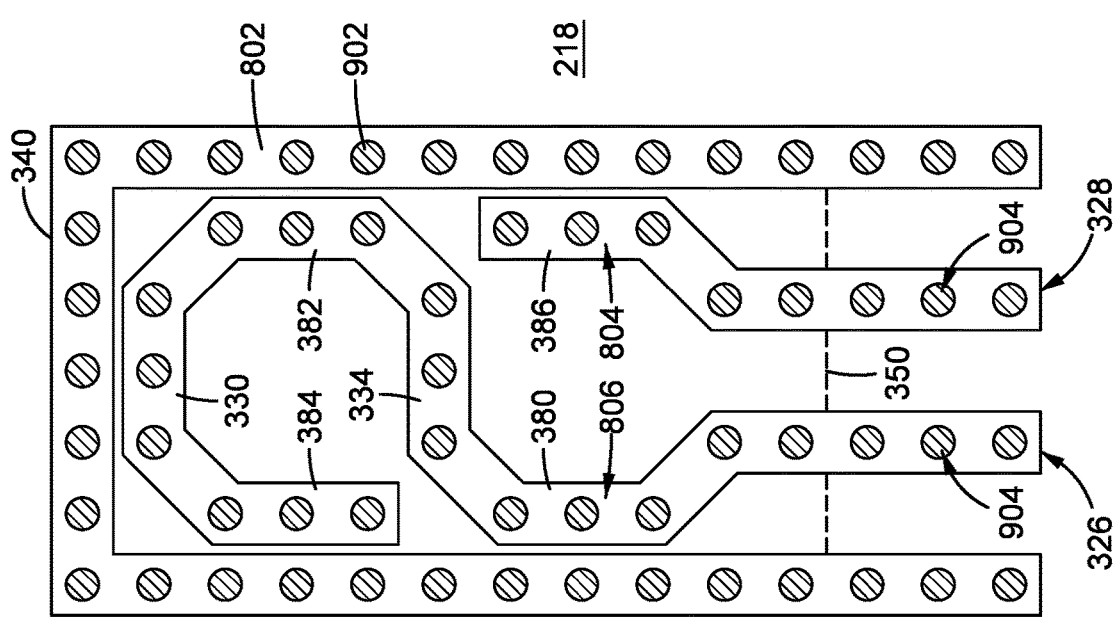
Figure 12:
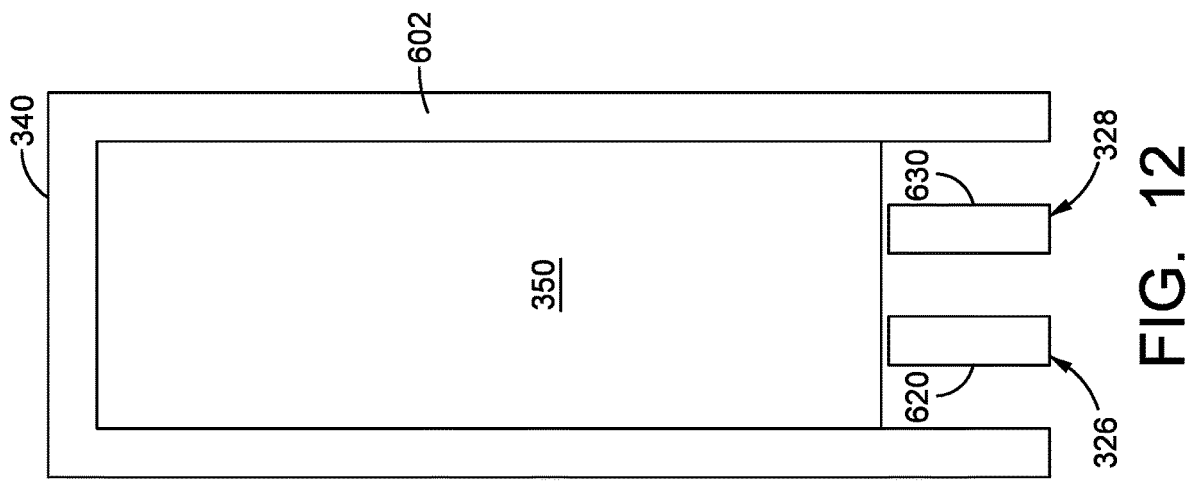
Figure 11:
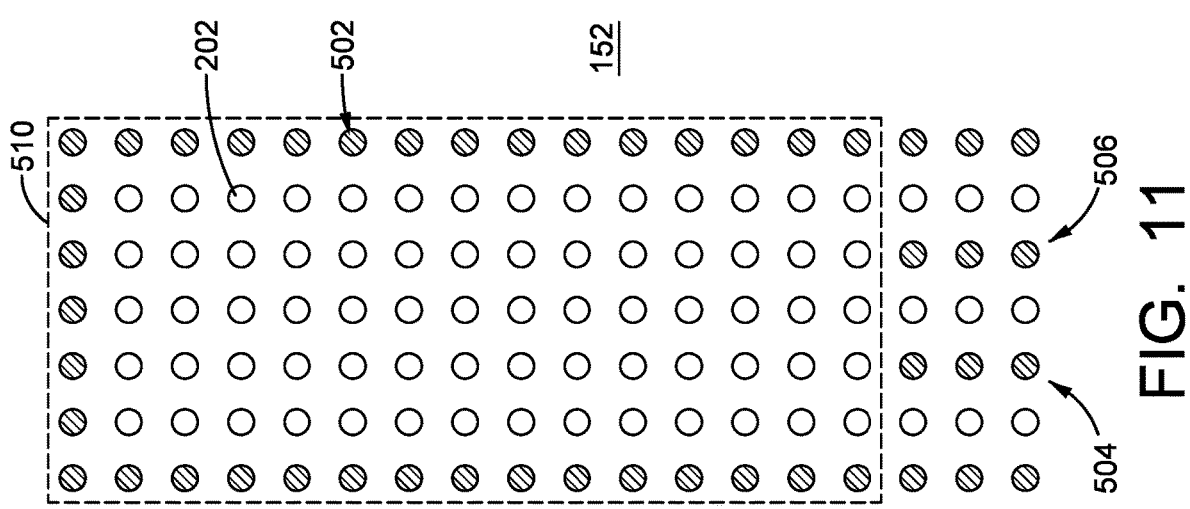

At operation 410, a first plurality of vias 902, a second plurality of vias 904, and a third plurality of vias 904 are formed, as shown in FIG. 9. The first plurality of vias 902 are formed on the metal traces 802, and are aligned with the first plurality of vias 702. The first plurality of vias 902, the metal traces 802, and the first plurality of vias 702 form a portion of the shield 340 (also as shown in FIG. 3).

The second plurality of vias 904 are formed on the metal trace 804 and are aligned with the second plurality of vias 704. The second plurality of vias 904, the metal trace 804, and the second plurality of vias 704 form a portion of the first lead 326 of the inductor 102.

Similarly, the third plurality of vias 906 are formed on the metal trace 806 and are aligned with the third plurality of vias 706. The third plurality of vias 906, the metal trace 806, and the third plurality of vias 706 form a portion of the second lead 328 of the inductor 102.

After operation 410 is complete, another dielectric layer 218 is disposed around the vias 902, 904, 906. The vias 902, 904, 906 may be fabricated similar to the vias 702, 704, 706.

Figure 10:
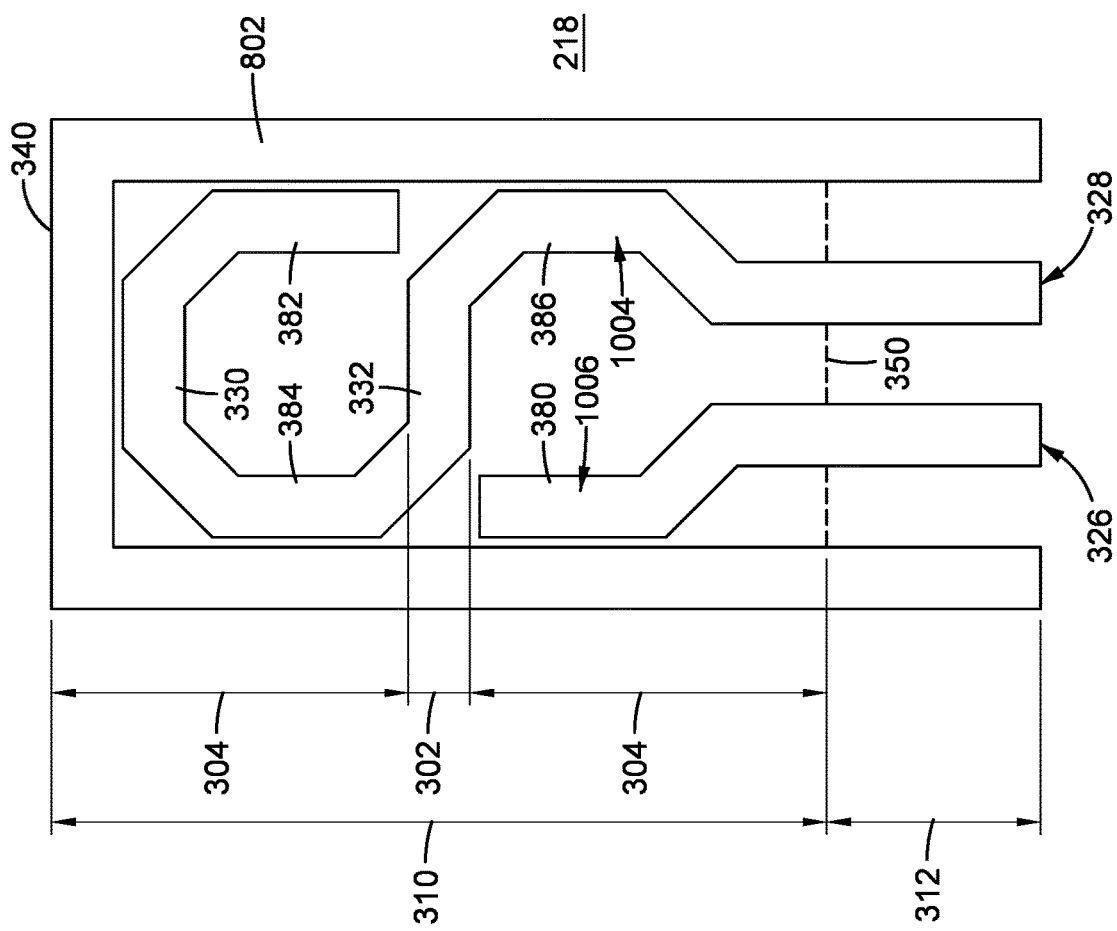

At operation 412, metal traces 1002, 1004 and 1006 are formed from the metal layer 208 of the RDL 116 that is disposed next to the metal layer 206, as shown in FIG. 10. The metal traces 1002, 1004 and 1006 may be solid, a mesh or has another suitable geometry. The metal traces 1004 and 1006 are separated from the traces 804, 806, except where interconnected by vias 904, 906 and the jumpers 332, 334 by one of the dielectric layers 218

The metal traces 1002 form a portion of the shield 340. The metal traces 1002 may be solid, a mesh or has another suitable geometry.

Also at operation 412, a portion of the metal layer 208 of the RDL 116 forms the trace 1004 over and interconnecting some of the third plurality of vias 904 and the second plurality of vias 904. The trace 1004 extends out of the tail region 312 into the head region 310. The trace 1004 also forms the second portion 386 of the first coil 320 in the loop region 304. The portion of the trace 1004 disposed in the first coil 320 in the loop region 304 are coupled to the trace 804 by the second plurality of vias 904. The trace 1004 extends from the second portion 386 of the first coil 320 into the cross over region 302 and forms the jumper 332. The portion of the trace 1004 disposed in the cross over region 302 is not coupled to any vias such that the jumper 332 is separated from the jumper 334 by one of the dielectric layers 218 of the RDL 116. The trace 1004 extends from the jumper 332 in the cross over region 302 to the second portion 384 of the second coil 322 in the second loop region 304. As part of the second coil 322, the trace 1004 also includes the connection trace 330 and the first portion 382 of the second coil 322. The trace 1004 terminates at or slightly within the cross over region 302. The portion of the trace 1004 disposed in the second coil 322 in the loop region 304 are coupled to the trace 806 by the second plurality of vias 904.

Also at operation 412, a portion of the metal layer 208 of the RDL 116 forms the trace 1006. The trace 1006 forms part of the first coil 320, and is connected to the portion of the trace 806 that also forms part of the first coil 320 by the second plurality of vias 904 that are disposed in the loop region 304 in which the first coil 320 resides. The trace 1006 also forms part of the lead 326.

Thus, after deposition of the traces 1004, 1006, the inductor 102 starts at lead 326, extends through the traces 806, 1006 forming part of the first coil 320, then across the jumpers 334 to the second coil 322. In the region of the second coil 322, the inductor 102 includes portion of the traces 806, 1004 coupled by vias 904. The second coil 322 is coupled by the jumper 332 to a portion of the first coil 320 that includes the trace 804 and a portion of the trace 1004 that are coupled by vias 906. The portion of the first coil 320 that includes the via connected traces 804, trace 1004 extends from the loop region 304 and into the tail region 312, terminating at the second lead 328.

At operation 414, the RDL 116 is completed. Completing the RDL 116 may include depositing additional patterned metal layers and dielectric layers necessary to complete the circuitry 114 of the RDL 116. At operation 416, a package substrate 128 is mechanically and electrically coupled to the RDL 116 to form the chip package 100. The package substrate 128 may be mechanically and electrically coupled to the RDL 116 via interconnects 108, such as by reflowing solder bumps to connect the circuitry 182 of the package substrate 128 to the circuitry 106 of the IC die 104 through the circuitry 114 of the RDL 116.

At an optional operation 418, the chip package 100 is mechanically and electrically coupled to a PCB 136 to form an electronic device 180.

Although the method 400 for fabricating a chip package 100 having an off-die inductor 102 fabricated within a redistribution layer (RDL) 116 adjacent an integrated circuit (IC) die 104 was described above with an exemplary off-die inductor 102 having two coils 320, 322, the method 400 may also be utilized to form an off-die inductor 102 having three or more coils. FIGS. 11-16 are a sequence of schematic bottom views depicting formation of a three coil off-die inductor 102 during various stages of fabrication. Additionally coils may also be added.

Operations 402, 404, 406 of the method 400 are as described above, and also shown in FIGS. 11, 12 and 13.

At operation 408, metal traces 802, 1402, 1404 and 1406 are formed from the metal layer 206 of the RDL 116 that is disposed next to the metal layer 204, as illustrated in FIG. 14. The metal traces 802 form a portion of the shield 340. The metal traces 802, 1402, 1404 and 1406 may be solid, a mesh or has another suitable geometry. The metal traces 1402, 1404 and 1406 are isolated from the ground plane 350 by one of the dielectric layers 218.

The metal traces 802 are formed on the first plurality of vias 702. The metal traces 802 and vias 702 form part of the shield 340.

Also at operation 408, a portion of the metal layer 206 of the RDL 116 forms a trace 1402 over and interconnecting the third plurality of vias 706. The trace 1402 extends out of the tail region 312 into the head region 310. The portion of the trace 1402 disposed the tail region 312 forms a portion of the lead 328. The portion of the trace 1402 disposed the head region 310 is separated from the ground plane 350 by one of the dielectric layers 218 of the RDL 116. The trace 1402 also forms a first portion of the first coil 320 in the loop region 304. The trace 1402 terminates at or slightly within the cross over region 302.

Also at operation 408, a portion of the metal layer 206 of the RDL 116 forms the trace 1404 over and interconnecting the second vias 704. The trace 1404 extends out of the tail region 312 into the head region 310. The portion of the trace 1404 disposed the tail region 312 forms a portion of the lead 326. The portion of the trace 1404 disposed the head region 310 is separated from the ground plane 350 by one of the dielectric layers 218 of the RDL 116. The trace 1404 also forms a second portion of the first coil 320 in the loop region 304. The trace 1404 extends from the first portion of the first coil 320 into the cross over region 302, and forms a first jumper 334 closest to the tail region 312. The first jumper 334 is not directly connected by vias to other metal layers within the region 302. The trace 1404 extends from the first jumper 334 in the cross over region 302 to the first portion of the second coil 322 in the second loop region 304. The trace 1404 extends from the first portion of the second coil 322 into the next cross over region 302, and forms a second jumper 334 defined between the second and third coils 222, 1408. The second jumper 334 is also not directly connected by vias to other metal layers within the region 302. The trace 1404 extends from the second jumper 334 in the second cross over region 302 to the first portion of the third coil 1408 in the third loop region 304. As part of the third coil 1408, the trace 1404 also includes the connection trace 330 and the second portion of the third coil 1408. The trace 1404 terminates at or slightly within the second cross over region 302.

Also at operation 408, a portion of the metal layer 206 of the RDL 116 forms the trace 1406 disposed in the head region 310 between the second and third coils 222, 1408. The trace 1406 also forms a portion of the second coil 322 in the loop region 304. The trace 1406 begins and terminates at or slightly within the cross over regions 302 on either side of the middle loop region 304.

Figure 15:
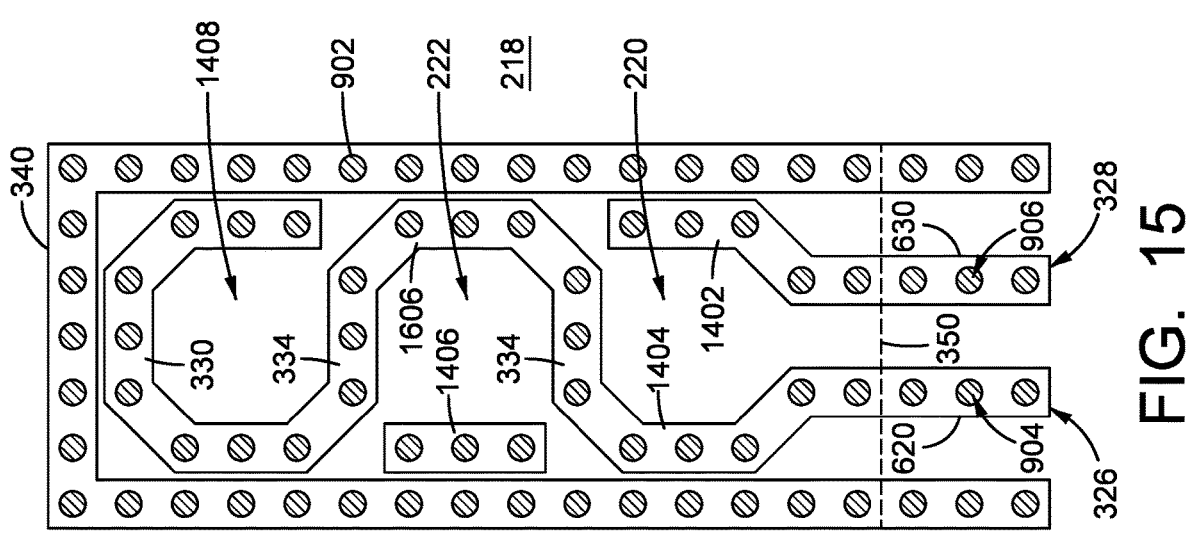

At operation 410, a first plurality of vias 902, a second plurality of vias 904, and a third plurality of vias 906 are formed, as shown in FIG. 15. The first plurality of vias 902 are formed on the metal traces 802, and are aligned with the first plurality of vias 702. The first plurality of vias 902, the metal traces 802, and the first plurality of vias 702 form a portion of the shield 340 (also as shown in FIG. 3).

The second plurality of vias 904 are formed on the metal trace 1404. Some of vias 904 disposed in the tail region 312 are aligned with the second plurality of vias 704. The metal trace 1404, and the aligned vias 704, 904 form a portion of the first lead 326 of the inductor 102. The second plurality of vias 904 are also formed on the metal trace 1404 in the loop regions 304 but not the cross over regions 302 of the head region 310.

Similarly, the third plurality of vias 906 are formed on the metal traces 1402, 1406. Some of vias 906 disposed in the tail region 312 are aligned with the third plurality of vias 706. The metal trace 1406, and the aligned vias 706, 906 form a portion of the second lead 328 of the inductor 102. The third plurality of vias 906 are also formed on the metal trace 1402 in the loop region 304.

None of the vias 902, 904, 906 (or other via) are disposed on the jumpers 334 or in the cross over regions 302 of the head region 310.

After operation 410 is complete, another dielectric layer 218 is disposed around the vias 902, 904, 906. The vias 902, 904, 906 may be fabricated similar to the vias 702, 704, 706.

Figure 16:
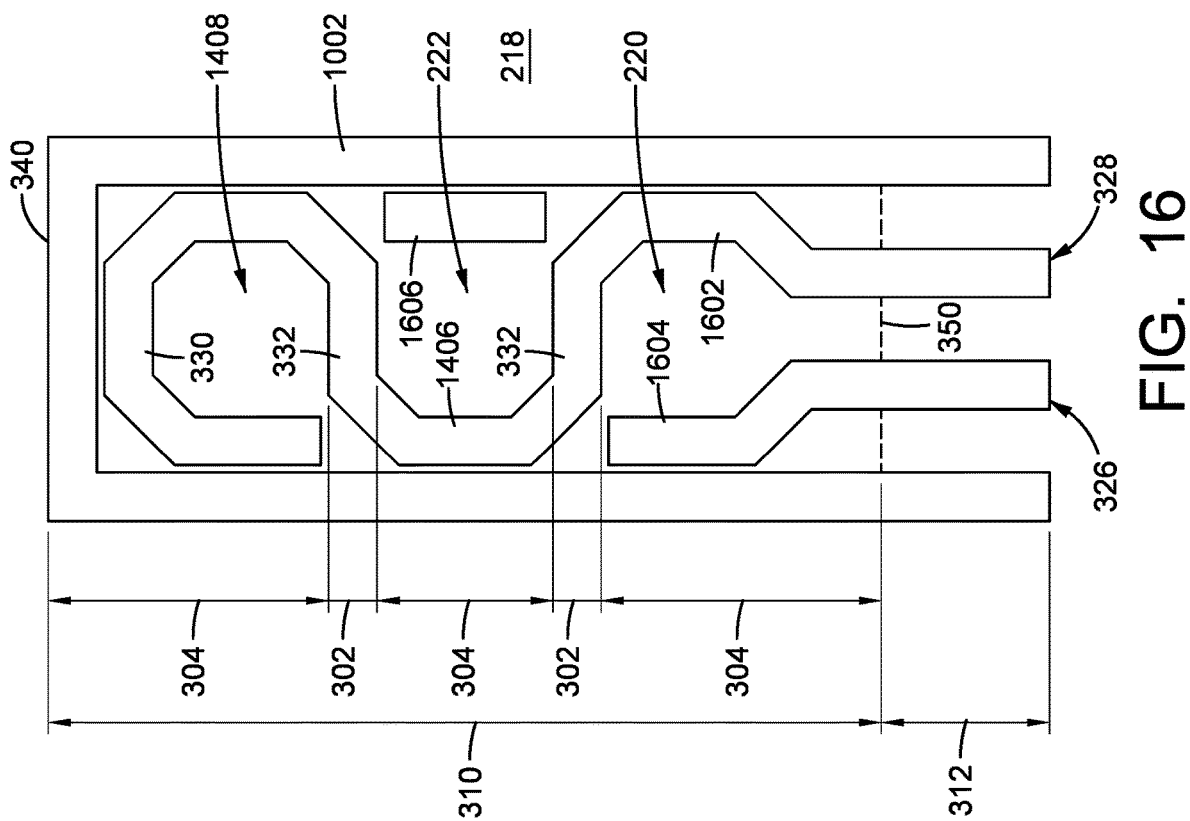

At operation 412, metal traces 1002, 1602 and 1604 are formed from the metal layer 208 of the RDL 116 that is disposed next to the metal layer 206, as shown in FIG. 16. The metal traces 1002, 1602 and 1604 may be solid, a mesh or has another suitable geometry. The metal traces 1602 and 1604 are separated from the traces 1402, 1404 by one of the dielectric layers 218, except where interconnected by vias 904, 906 and the jumpers 332, 334.

The metal traces 1002 form a portion of the shield 340. The metal traces 1002 may be solid, a mesh or has another suitable geometry.

Also at operation 412, a portion of the metal layer 208 of the RDL 116 forms the trace 1602 over and interconnecting some of the second plurality of vias 904 and the third plurality of vias 906. The trace 1602 extends out of the tail region 312 into the head region 310. A portion of the trace 1602 residing in the tail region 312 is coupled by the vias 906 to the trace 1402, and forms part of the lead 328.

A portion of the trace 1602 residing in the loop region 304 closest to the tail region 312 also forms the second portion of the first coil 320. The portion of the trace 1602 comprising a portion of the first coil 320 in the loop region 304 is coupled to the trace 1402 by the second plurality of vias 904. The trace 1602 extends from the second portion of the first coil 320 into the cross over region 302 closest to the tail region 312 and forms the first jumper 332. The portion of the trace 1602 disposed in the cross over region 302 is not coupled to any vias such that the first jumper 332 is separated from the first jumper 334 in the same cross over region 302 by one of the dielectric layers 218 of the RDL 116. The trace 1602 extends from the jumper 332 in the first cross over region 302 to the second portion of the second coil 322 in the second loop region 304. The trace 1602 extends from the second portion of the second coil 322 into the second cross over region 302 disposed between adjacent loop regions 304 and forms a second jumper 332. The portion of the trace 1602 disposed in the cross over region 302 is not coupled to any vias such that the second jumper 332 is separated from the first jumper 334 in the same cross over region 302 by one of the dielectric layers 218 of the RDL 116. The trace 1602 extends from the second jumper 332 in the first cross over region 302 to the first portion of the third coil 1408 in the second loop region 304. As part of the third coil 1408, the trace 1602 also includes the connection trace 330 and the first portion of the third coil 1408. The trace 1602 terminates at or slightly within the second cross over region 302. The portion of the trace 1602 disposed in the third coil 1408 in the loop region 304 is coupled to the trace 1404 by the second plurality of vias 904.

Also at operation 412, another portion of the metal layer 208 of the RDL 116 forms the trace 1604. The trace 1604 extends out of the tail region 312 into the head region 310. A portion of the trace 1604 residing in the tail region 312 is coupled by the vias 904 to the trace 1404, and forms part of the lead 326.

A portion of the trace 1604 residing in the loop region 304 closest to the tail region 312 also forms the portion of the first coil 320. The portion of the trace 1604 comprising a portion of the first coil 320 in the loop region 304 is coupled to the trace 1404 by the second plurality of vias 904. The trace 1604 terminates at or slightly within the cross over region 302 closest to the tail region 312.

Also at operation 412, another portion of the metal layer 208 of the RDL 116 forms the trace 1606. The trace 1606 is disposed in the head region 310 between the first and second coils 220, 222. The trace 1606 also forms a second portion of the second coil 322 in the loop region 304. The trace 1606 begins and terminates at or slightly within the cross over regions 302 on either side of the middle loop region 304. The trace 1606 is coupled by the vias 906 to the trace 1406.

Thus, after deposition of the traces 1602, 1604, 1606, the inductor 102 starts at lead 326, through the trace 1604 forming part of the first coil 320, then across the first jumper 334 to the second coil 322. In the region of the first coil 322, the inductor 102 includes portion of the trace 1604 coupled by vias 904 to the trace 1404. In the region of the second coil 322 coupled to the first jumper 334, the inductor 102 includes portion of the trace 1606 coupled by vias 904 to the trace 1404. The third coil 1408 is coupled to the second coil 222 by one of the jumpers 334 and one of the jumpers 332. The portions of the traces 1404 and 1602 comprising the third coil 1408 are coupled by vias 904. The third coil 1408 is coupled to the second coil 222 by the jumper 332 farthest from the tail region 312. In the portion of second coil 322 coupled between the two jumpers 332, the trace 1602 is coupled to the trace 1406 by vias 906. The second coil 1408 is coupled to the first coil 220 by the jumper 332 closest to the tail region 312. The portion of the first coil 220 coupled the jumper 332 closest to the tail region 312 comprises portions of traces 1402 and 1602 that are coupled by vias 906, and extends into the tail region 312 to form the lead 328.

Thus, a chip package and method for fabricating have been described that includes an off-die inductor disposed in the redistribution layers formed directly below the IC die. Positioning the off-die inductor immediately adjacent the IC die improves communication speeds and reliability, while also freeing space within the IC die space normally occupied by on-die inductors hfor additional IC device, improved power routing, and the like.

While the foregoing is directed to embodiments of the present invention, other and further embodiments of the invention may be devised without departing from the basic scope thereof, and the scope thereof is determined by the claims that follow.

What is claimed is:

1. A chip package comprising:
    an integrated circuit (IC) die;
    a package substrate having a die side and a ball side;
    a redistribution layer (RDL) disposed between the IC die and the die side of the package substrate, the RDL comprising at least a first conductive layer and a second conductive layer that are patterned to form a RDL circuitry within the RDL, the RDL circuitry connecting the IC die to the package substrate; and
    an inductor formed from portions of the first conductive layer and the second conductive layer of the RDL, wherein the inductor is directly below a bottom surface of the IC die.

2. The chip package of claim 1, wherein the IC die further comprises:
    a plurality of contact pads arranged in an array having a pitch in a first direction, and wherein the inductor has a width that is less than 3 times the pitch of the contact pads in the first direction.

3. The chip package of claim 1, wherein the RDL further comprises:
    a shield formed from portions of the first conductive layer and the second conductive layer of the RDL, wherein the shield circumscribes at least three sides of the inductor.

4. The chip package of claim 1, wherein the inductor comprises:
    a head region comprising coils; and
    a tail region comprising leads coupled to the coils.

5. The chip package of claim 4, wherein the head region of the inductor comprises:
    vias connecting portions of the first conductive layer and the second conductive layer forming a first coil of the coils formed in the head region;
    vias connecting portions of the first conductive layer and the second conductive layer forming a second coil of the coils formed in the head region;
    a first jumper formed in the first conductive layer and coupling a portion of the first coil to the second coil; and
    a second jumper formed in the second conductive layer and coupling another portion of the first coil to the second coil, the second jumper passing over the first jumper.

6. The chip package of claim 5, wherein no vias directly couple the first jumper to the second jumper.

7. The chip package of claim 4, wherein the RDL further comprises:
    a ground plane disposed between the inductor and the IC die.

8. The chip package of claim 7, wherein the ground plane is formed from a portion of a third metal layer disposed between the head region of the inductor and the IC die, wherein the ground plane is spaced from a portion of the third metal layer disposed in the tail region of the inductor and the IC die.

9. The chip package of claim 1, wherein the RDL further comprises:
a third metal layer forming a ground plane disposed between the inductor and the IC die.

10. The chip package of claim 9, wherein the RDL further comprises:
a ground shield formed from portions of the first conductive layer and the second conductive layer of the RDL that form the inductor, wherein the ground shield is coupled to the ground plane.

11. A chip package comprising:
an integrated circuit (IC) die;
a package substrate having a die side and a ball side;
a redistribution layer (RDL) disposed between the IC die and the die side of the package substrate; and
an inductor disposed in the RDL and sandwiched between the IC die and the package substrate, the inductor comprising a first terminal coupled to a circuitry of the IC die and a second terminal coupled to the circuitry of the IC die, wherein the inductor is directly below a bottom surface of the IC die.

12. The chip package of claim 11, wherein the IC die further comprises:
a plurality of contact pads arranged in an array having a pitch in a first direction, and wherein the inductor has a width that is less than 3 times the pitch of the contact pads in the first direction.

13. The chip package of claim 11, wherein the RDL further comprises:
a first conductive layer;
a second conductive layer; and
a shield formed from portions of the first conductive layer and the second conductive layer of the RDL, wherein the shield circumscribes at least three sides of the inductor.

14. The chip package of claim 13, wherein the inductor comprises:
a head region comprising coils formed from the first and second conductive layers; and
a tail region comprising leads coupled to the coils.

15. The chip package of claim 14, wherein the head region of the inductor comprises:
vias connecting portions of the first conductive layer and the second conductive layer forming a first coil of the coils formed in the head region;
vias connecting portions of the first conductive layer and the second conductive layer forming a second coil of the coils formed in the head region;
a first jumper formed in the first conductive layer and coupling a portion of the first coil to the second coil; and
a second jumper formed in the second conductive layer and coupling another portion of the first coil to the second coil, the second jumper passing over the first jumper.

16. The chip package of claim 15, wherein no vias directly couple the first jumper to the second jumper.

17. The chip package of claim 13, wherein the RDL further comprises:
a ground plane disposed between the inductor and the IC die.

18. The chip package of claim 17, wherein the ground plane is formed from a portion of a third metal layer disposed between a head region of the inductor and the IC die, wherein the ground plane is spaced from a portion of the third metal layer disposed in a tail region of the inductor and the IC die.

19. The chip package of claim 11, wherein the RDL further comprises:
a third metal layer forming a ground plane disposed between the inductor and the IC die.

20. A method for fabricating a chip package, the method comprising:
forming an inductor within a redistribution layer (RDL) formed on an integrated circuit (IC) die, wherein the inductor is directly below a bottom surface of the IC die; and
stacking the RDL with a package substrate to form a chip package.

* * * * *